United States Patent
Hougham et al.

(10) Patent No.: US 7,452,568 B2
(45) Date of Patent: Nov. 18, 2008

(54) CENTRIFUGAL METHOD FOR FILING HIGH ASPECT RATIO BLIND MICRO VIAS WITH POWDERED MATERIALS FOR CIRCUIT FORMATION

(75) Inventors: Gareth Hougham, Ossining, NY (US); Leena Paivikki Buchwalter, Hopewell Junction, NY (US); Stephen L. Buchwalter, Hopewell Junction, NY (US); Jon Casey, Poughkeepsie, NY (US); Claudius Feger, Poughkeepsie, NY (US); Matteo Flotta, Fishkill, NY (US); Jeffrey D. Gelorme, Burlington, CT (US); Kathleen C. Hinge, Tarrytown, NY (US); Anurag Jain, Poughkeepsie, NY (US); Sung K. Kang, Chappaqua, NY (US); John U. Knickerbocker, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 694 days.

(21) Appl. No.: 11/049,846

(22) Filed: Feb. 4, 2005

(65) Prior Publication Data
US 2006/0177568 A1      Aug. 10, 2006

(51) Int. Cl.
*B05D 3/12* (2006.01)
*B05D 1/42* (2006.01)

(52) U.S. Cl. .............. 427/240; 427/272; 427/277; 427/282; 427/294; 427/346; 427/356; 427/368; 427/458; 427/466; 427/468; 118/50; 118/52; 118/57; 118/107; 118/320; 118/621

(58) Field of Classification Search ............... 427/240, 427/346, 356, 368, 294, 429, 425, 272, 277, 427/282, 458, 466, 468; 118/52, 320, 621, 118/107, 50, 57
See application file for complete search history.

(56) References Cited

U.S. PATENT DOCUMENTS

| | | | |
|---|---|---|---|
| 3,997,105 A | 12/1976 | Hayden et al. | |
| 4,271,209 A * | 6/1981 | DePalma et al. | 427/58 |
| 4,286,443 A | 9/1981 | Hunter | |
| 4,400,166 A | 8/1983 | Chulay et al. | |
| 4,585,434 A | 4/1986 | Cole et al. | |
| 5,062,896 A | 11/1991 | Huang et al. | |
| 5,376,403 A | 12/1994 | Capote et al. | |
| 5,538,789 A | 7/1996 | Capote et al. | |
| 5,591,114 A | 1/1997 | Romanauskas | |
| 5,652,042 A | 7/1997 | Kawakita et al. | |
| 5,716,663 A | 2/1998 | Capote et al. | |
| 5,744,285 A | 4/1998 | Felton et al. | |
| 5,830,389 A | 11/1998 | Capote et al. | |
| 5,865,891 A * | 2/1999 | Linliu | 118/52 |
| 5,912,046 A * | 6/1999 | Eldridge et al. | 427/126.2 |
| 5,948,533 A | 9/1999 | Gallagher et al. | |
| 5,977,490 A | 11/1999 | Kawakita et al. | |

(Continued)

*Primary Examiner*—Kirsten C Jolley
(74) *Attorney, Agent, or Firm*—Connolly Bove Lodge & Hutz LLP; Daniel P. Morris, Esq.

(57) ABSTRACT

The present disclosure relates generally to semiconductor, integrated circuits, and particularly, but not by way of limitation, to centrifugal methods of filling high-aspect ratio vias and trenches with powders, pastes, suspensions of materials to act as any of a conducting, structural support, or protective member of an electronic component.

1 Claim, 13 Drawing Sheets

U.S. PATENT DOCUMENTS

| | | |
|---|---|---|
| 6,054,761 A | 4/2000 | McCormack et al. |
| 6,059,952 A | 5/2000 | Kang et al. |
| 6,723,238 B2 | 4/2004 | Romanauskas |
| 6,783,675 B1 | 8/2004 | Rovira |

* cited by examiner

Via filling centrifuge showing substrates with empty vias on 4 opposing sites against centrifuge wall.

Figure 3. Via Filling by Centrifuge – full immersion.
(different from post vacuum fill centrifugal compaction)

Centrifuge with wafers mounted on the outside perimeter of a fluid chamber. Fluid consists of dilute suspension of particles intended for packing into vias.

Via being filled with accumulating particles

Top view looking down into A centrifuge chamber

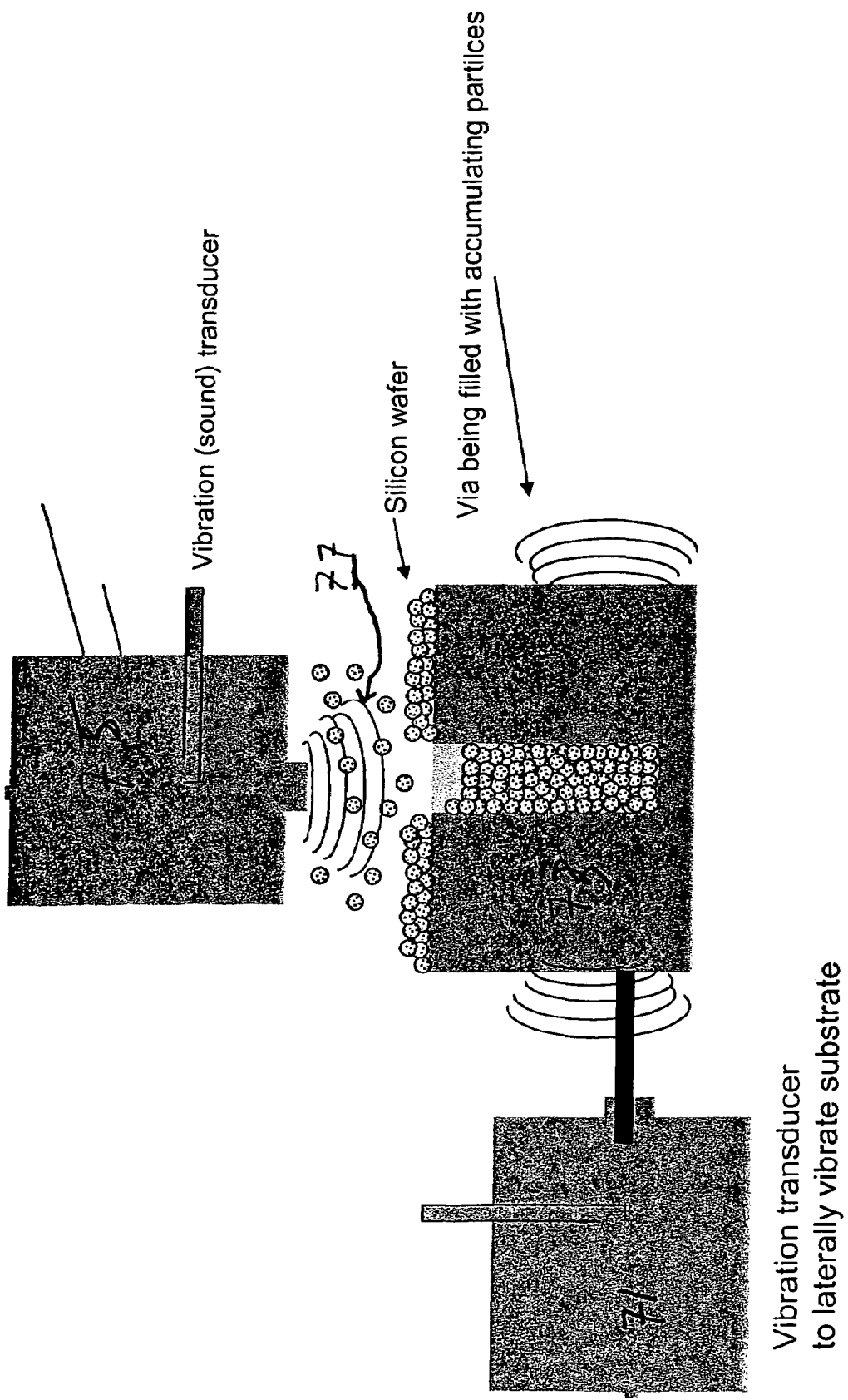
Figure 7: Vibration of liquid medium and/or substrate in radial and/or tangential directions.

Figure 8: Via Filling by Centrifuge - Spraying.

Spray dilute suspension of metal particles at wafers while they are spinning in centrifuge. Particles will be driven to bottom of via. Less dense solvent will fall to drain and be recycled. Continue until vias are full. Stop spraying. Dry in situ while centrifuging.
THIS IS NOTHING MORE THAN THE SPIN CYCLE OF A MAYTAG Washer

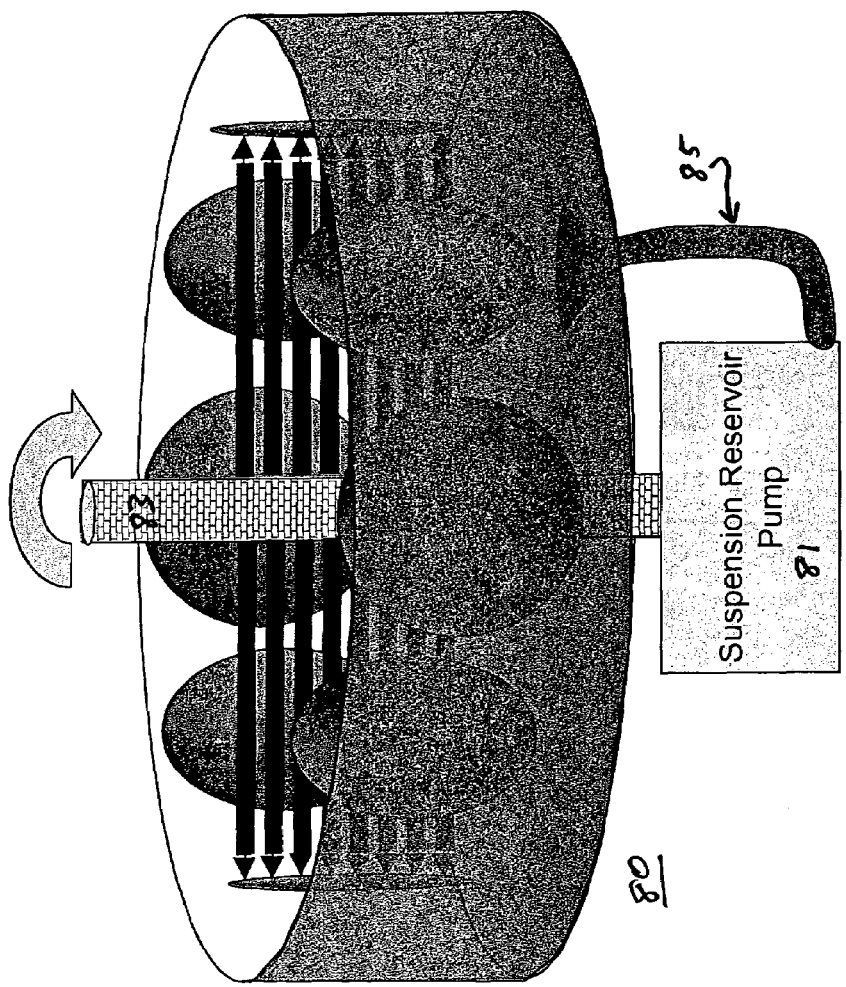

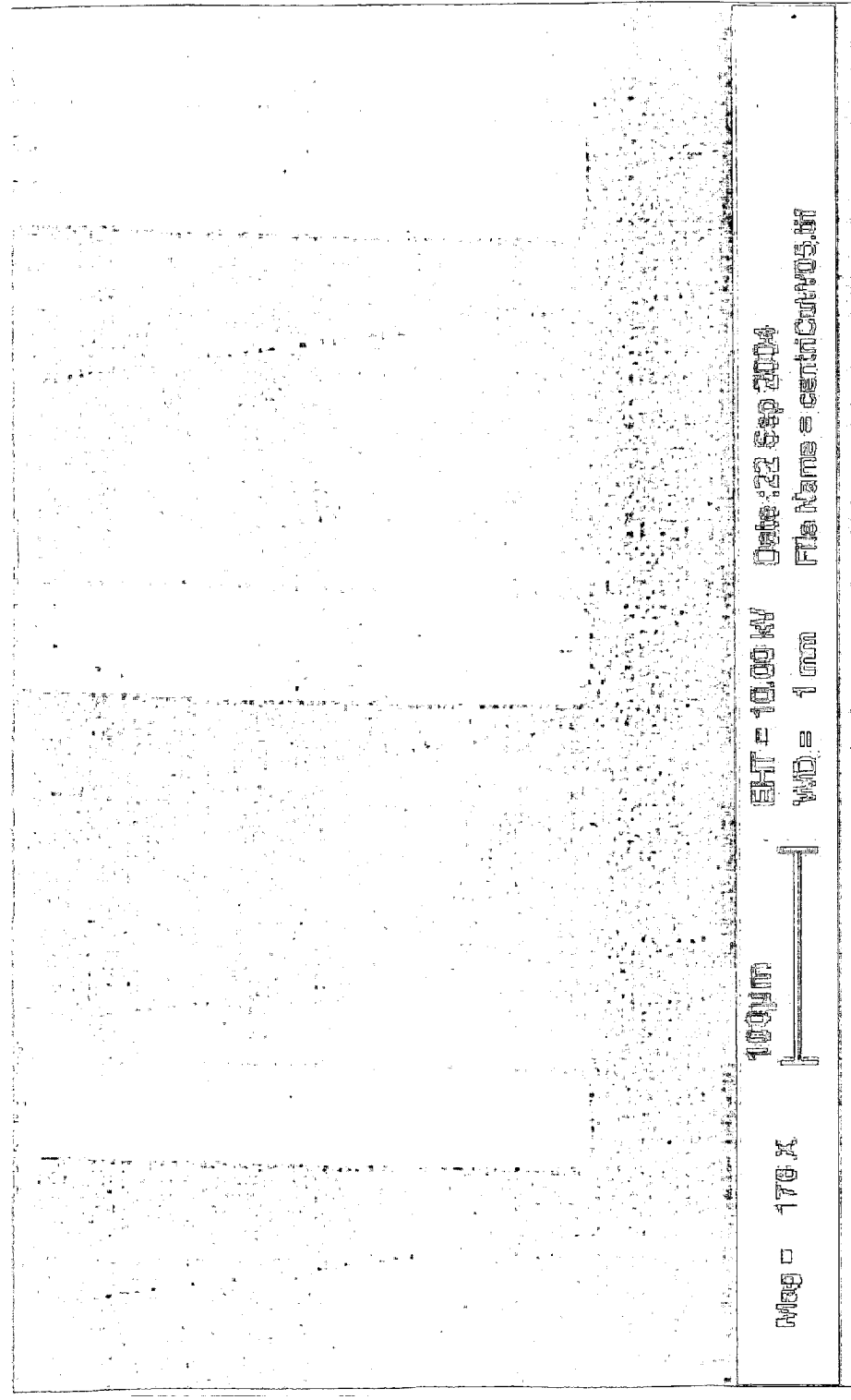

CENTRIFUGAL METHOD FOR FILING HIGH ASPECT RATIO BLIND MICRO VIAS WITH POWDERED MATERIALS FOR CIRCUIT FORMATION

FIELD OF THE INVENTION

The present disclosure relates generally to semiconductor, integrated circuits, and particularly, but not by way of limitation, to centrifugal methods of filling high-aspect ratio blind vias and trenches with powders, pastes, suspensions, and viscous fluids.

BACKGROUND

Increasingly, applications require that high aspect ratio trenches and/or vias be filled with powders or paste materials as a step in the fabrication of z-direction electrical circuits. One such application is the formation of z-direction line circuitry in ceramic, glass, silicon, or organic substrates. Such vias have high aspect ratios which make them difficult to fill. Particularly when they are so called "blind" via or closed at one end and open on the other. For instance they are sometimes only tens of microns in diameter, while being hundreds of microns in depth. Traditional methods for filling pastes, powders, suspensions and viscous fluids into such vias are not adequate.

One traditional method for filling high aspect ratio vias with metal pastes requires the creation of a partial vacuum, typically in the milli torr range, followed by the application of metal paste onto the substrate surface and squeezing the paste over and into the via. If the viscosity is low enough, the paste will push into the via. There are however two significant drawbacks to this method.

A first drawback, illustrated in FIG. 1, relates to the pocket of gas that is trapped in the via. FIG. 1 shows a substrate 10 having vias 12 filled with copper coated tungsten powder which has been sintered post-filling. The copper sinter manifests significant voiding 14 that arises because the vacuum is generally poor (i.e. of fairly high pressure in the millitorr range). When the paste is screened or squeezed into the via, the via becomes covered with paste and a quantity of gas in the volume of the via is trapped. Reducing fill chamber vacuum may result in undesirable paste drying due to solvent removal. Thus a compromise between fill chamber vacuum and retained void must be made. As the paste is subsequently packed, the gas is compressed and pushed to the via bottom. This gas bubble cannot escape through the very high viscosity paste and results in a permanent void. This void can be large enough to preclude reliable electrical interconnection through that via, and also constitutes a structural defect. FIG. 1 also shows that the vias are open to the substrate via-surface.

A second deficiency relates to the composition of metal pastes, which, of necessity, consists of a mixture metal particles and a liquid medium. After application, the paste is dried and the liquid medium is removed leaving a pure metal packing ready to be sintered to a solid. The removal of the liquid medium causes shrinkage and often requires a second (or third or more) application of paste to achieve reasonably complete filling. Several iterative evacuation, filling, drying, and sintering steps may be required to properly fill vias and trenches. However, the multiple steps are very expensive increasing turn-around-time.

A need therefore exists for a single-step method to fill high-aspect ratio trenches and vias in a manner that avoids or minimizes void formation.

Other objects and advantages will become apparent from the following disclosure.

SUMMARY OF INVENTION

The instant disclosure teaches a method for filling microvias in a single step and in a way that does not result in significant void formation. The present invention describes a centrifugal method for filling vias and/or trenches with a powder, which in the preferred embodiment is a metal powder that will be fused in a subsequent heating step into a porous solid to be suitable for electrical conduction.

An aspect of the present invention provides a process and method for filling high-aspect ratio openings on a substrate immersing the substrate in a suspension of particles in a liquid medium and centrifuging the substrate. The liquid medium may be termed a suspension fluid.

According to an aspect of the present invention, centrifugation is performed in a tub rotor. Further according to this aspect the substrate is mechanically supported in a holder or frame mounted against an inner wall of the tub rotor.

According to an aspect of the present invention, centrifugation is performed in a swinging-bucket rotor. Further according to this aspect the substrate is mechanically supported in a bucket or basket, pivotally attached to a central rotating member. According to a further aspect, the buckets hang vertically for loading and unloading. During rotation, the buckets rotate, radially, to a substantially horizontal position.

An aspect of the present invention provides a process and method for filling high-aspect ratio openings on a substrate, wherein the particulate suspension comprises a fluid and a metal powder.

An aspect of the present invention provides a process and method for filling high-aspect ratio openings on a substrate, wherein the metal particulate fraction may be copper-coated tungsten, metal and/or non-metal powders or flakes, or alternatively they can be metal-coated dielectric particles. In a further embodiment, the particles may comprise a core coated with a conductive material such as a metal or alloy. The core may be any of glass, ceramic, metal, or polymer.

An aspect of the present invention provides a process for filling high-aspect ratio openings, wherein the suspending fluid may be water, an organic solvent, or a mixture thereof. In a further aspect, the fluid solvent is removed prior to sintering or otherwise fusing the particles.

An aspect of the present invention provides the suspending fluid may be a reactive fluid or mixture such as an epoxy. In a further aspect, following centrifugation the reactive fluid is polymerized to a solid by heating. In an aspect, polymerization is effected by exposure to actinic radiation such as, but not limited to, ultraviolet light or electron beam radiation.

In an embodiment, the suspending fluid is a melt material such as a melted polymer or melted metal solder. In an embodiment, the reactive or melt material hardens after centrifugation. The hardened material, together with the powdered material results in a composite material in the via. In a further embodiment, the melt is a thermoplastic material above a softening temperature.

An aspect of the present invention provides that a vibration is applied during centrifugation. An aspect provides the vibration is applied to the semiconductor substrate. A further aspect provides that the vibration is applied to the particulate suspension.

In another aspect of the present invention, a charge is applied to the substrate during centrifugation to facilitate an electrophoretic or electrostatic fill enhancement.

An aspect of the present invention provides a process for filling high-aspect ratio openings, further comprising drying the centrifugally-packed suspension to a substantially dry mass. A further aspect provides that the centrifugally-packed, dried mass is sintered to a solid. In yet a further aspect, the sintered solid may be porous. A further aspect of the invention provides a process to cure the reactive liquid (such as epoxy) and/or to cool the molten liquid into a solid composite material in the via.

An aspect of the present invention provides displacing air or other gas from the vias by a wetting fluid. In an aspect, the wetting fluid strongly wets the substrate in which the via is formed. In an aspect, the wetting fluid may be the same as, or different from the suspension fluid. In a further aspect, via wetting occurs under a partial vacuum. In a still further aspect, the suspension liquid can be subjected to a vacuum environment beforehand to degas it. In a still further aspect, the substrate is evacuated before being brought into contact with the wetting liquid.

Still other aspects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWINGS

The invention is best understood from the following detailed description when read in connection with the accompanying drawings. It is emphasized that, according to common practice, the various features of the drawing are not to scale. On the contrary, the dimensions of the various features are arbitrarily expanded or reduced for clarity. Included in the drawing are the following figures:

FIG. 7 depicts vibration of the liquid medium and/or the substrate in radial and/or tangential directions;

FIG. 8 depicts via filling by a centrifuge-spraying method;

FIG. 11 is an electron micrograph of vias filled by the process of the present invention.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

The term "via" comprehends vias, microvias, and trenches. The present invention is described in terms of, and is advantageously practiced with blind vias, but is not thereby limited and may suitably be practiced with blind vias, through-vias, and through-holes. The present invention is described in terms of, and is advantageously practiced with high aspect ratio vias and trenches. However, the present invention is not thereby limited and may suitably be practiced with vias of any aspect ratio.

Reference is made to the figures to illustrate selected embodiments and preferred modes of carrying out the invention. It is to be understood that the invention is not hereby limited to those aspects depicted in the figures.

Figure 1:
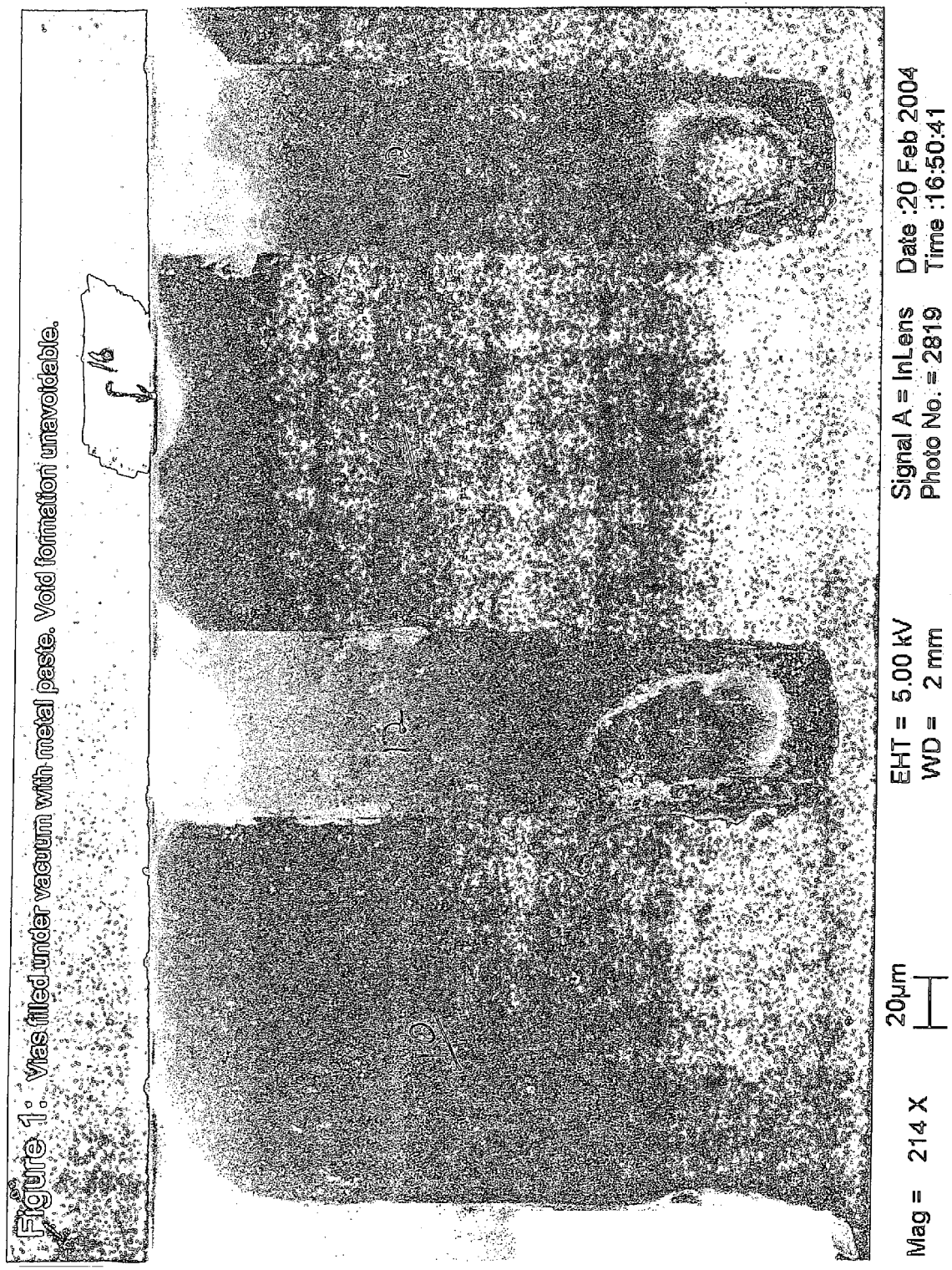
FIG. 1 is an electron micrograph showing void formation in vias filled with metal paste using prior art methods.
Figure 2:
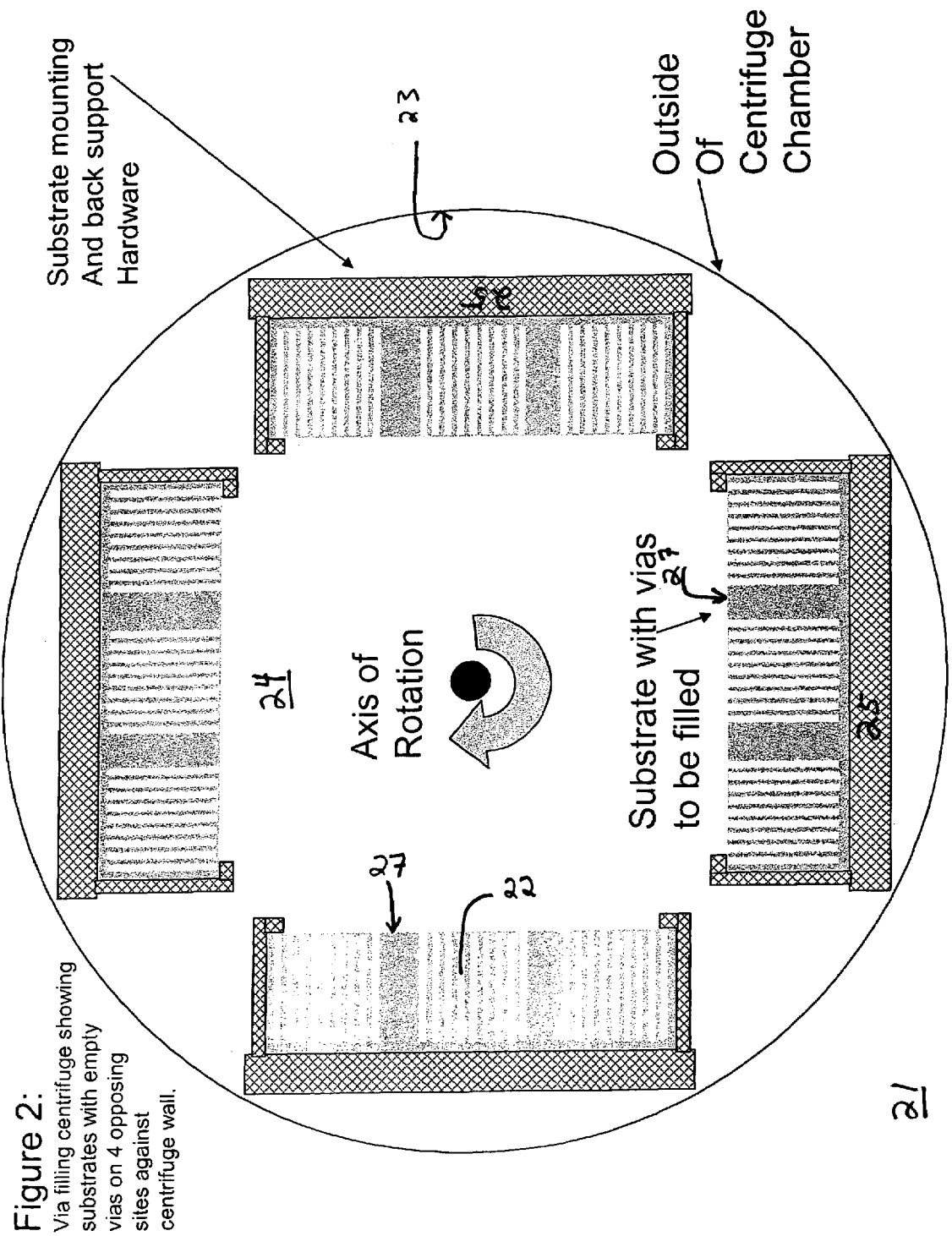
FIG. 2 depicts substrates, with vias to be filled, mounted on an inner wall.

FIG. 2 depicts a top-view of a drum, or tub, centrifuge. Drum 21 is disposed generally, as the drum, or tub, of a top-loading washing-machine as for washing clothes. Affixed to an inner wall 23 of drum 21 is at least one substrate mounting and support device 25. Preferably, a plurality of mounting device 25 is affixed to inner wall 23. In an embodiment, the plurality of mountings 25 are disposed such that drum 21 is dynamically-balanced. A drum is dynamically-balanced when it experiences a minimum tendency to oscillate or vibrate when undergoing centrifugal rotation. In an alternative embodiment, the plurality of mountings 25 are disposed such that drum 21 vibrates during rotation. Inner wall 23 may be termed a centrifugal wall.

Each mounting 25 is disposed to receive and support at least one substrate 27, which may be, for example, a semiconductor wafer. Each substrate 27 is disposed solidly mounted with its flat plane perpendicular to the plane of centrifugal rotation. Substrate 27 is provided at least one opening 22 which may be a via opening or a trench. The via/trench opening is defined on a substrate via-surface. In preferred embodiments opening 22 is of high aspect ratio. Drum 21 is disposed to contain at least a liquid in chamber 24. In operation, chamber 24 is filled with a dilute suspension of particles that are intended for packing into openings 22. The particles are suspended in a liquid (suspension fluid). Chamber 21 is rotated at an appropriate rotational speed causing the particles to pack tightly into openings 22.

When the chamber rotates at high speed, particles having a greater density or specific gravity than the fluid component of the suspension push radially outward. When a particle traveling radially encounters an opening 22, it will penetrate inside displacing fluid and settling on the bottom. Such particles will accumulate in openings 22 which may be a via or a trench. Particles will also accumulate into an unwanted mat on the outside of the vias across the substrate. Centrifugation is carried out for a length of time sufficient for openings 22 to become completely filled or even overfilled. Following filling of openings 22, the centrifuge is stopped and the substrates removed, and the mat of excess particles on the top of the substrate is removed by scraping or wiping.

In an embodiment, the suspension fluid is a non-reactive liquid. The term "non-reactive" comprehends a liquid, such as water or an organic solvent, which has little or no tendency to solidify at about room temperature. Such liquids tend not to polymerize, gel, or freeze. The non-reactive liquid may further comprises an auxiliary selected from the group consisting of dispersing agents, soaps, detergents, and surfactants. The residual liquid is removed from the vias by a process such as heating to evaporate the liquid and/or by exposure to a vacuum. Where the particles were tightly packed by centrifugation, removal of residual liquid should result in minimal, if any, shrinkage of the material packed in openings 22. The dried substrate is solidified by any suitable process. By way of non-limiting example, the dried substrate is exposed to hydrogen reducing conditions at a temperature high enough to fuse the particles together.

In an embodiment, the fluid further comprises a dispersant. The dispersant may be a non-ionic detergent. A non-limiting example of a suitable non-ionic detergent is Triton X-100. A suitable dispersant may be selected from condensed naphthalene sulfonates, such as DAXAD™ (Hampshire Chemicals); functionalized silanes; and silazanes, such as, but not limited to hexamethylsilazane (HMDS). The forgoing examples are illustrative of the choices available to one skilled in the art and are not limiting.

In an embodiment, the suspension fluid is a reactive liquid. The term "reactive" comprehends fluids that tend to polymerize. Such polymerization may be induced by heat, actinic radiation, catalysts, or other causes. A non-limiting example of a reactive fluid is an epoxy resin. Following via packing, the suspension packed in the vias is polymerized by exposure to an appropriate agent such as heat or actinic radiation. The reactive fluid is suitably a curable liquid resin selected from the group consisting of epoxies, reactive crosslinkable polymers, cyanate esters, bismaleimides, phenol formaldehydes, polynorbornenes, polystyrenes, polyacrylates, polyesters, polyurethanes, polycarbonates, polyimides, polyaryletherketones, silicones, fluorinated resins, and derivatives thereof.

In an embodiment, the suspension fluid is a liquid melt maintained above a "freezing" temperature. In an embodiment, the melt is a solder or low melting point metal or alloy maintained above a liquification temperature. In such embodiments, simply cooling the substrate serves to solidify, or "freeze" the material in the vias. Cooling may be by active means, such as by mechanical refrigeration, or the cooling may be passive, as by merely allowing he substrate to reach ambient room temperature. The melt may suitably comprise solder, tin, bismuth, lead, or any other low melting point metal or alloy. The melt may also comprise a thermoplastic polymer such as a polyimide or a cross linking bismaleimide.

Figure 3:
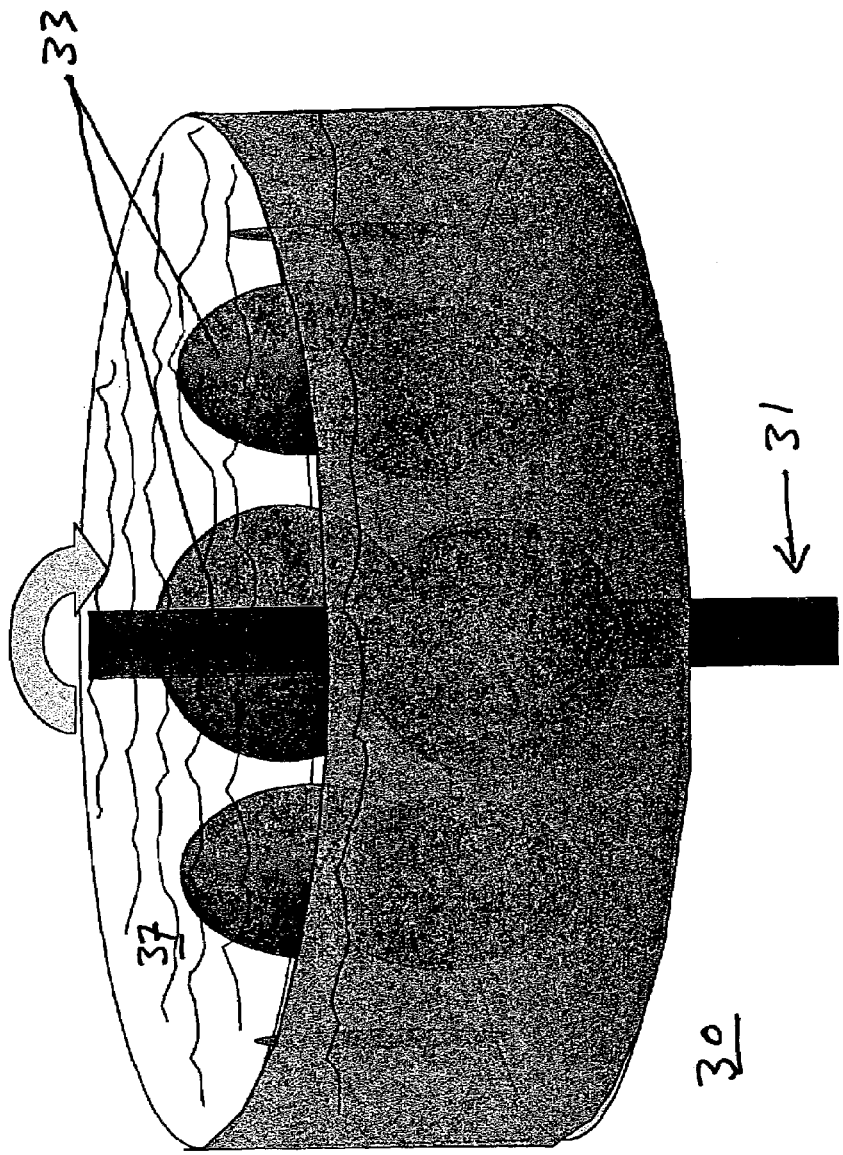
FIG. 3 depicts via filling by full-immersion centrifugation.

FIG. 3 provides an isometric, side elevation view of such a loaded centrifuge filled with fluid suspension. Tub rotor 30 corresponds to chamber 21. The rotor is filled with a fluid 37 containing particles in suspension. The figure further depicts a plurality of substrates 33 mounted adjacent to portions of an inner wall 35 of rotor 30. The substrate mountings (depicted as numeral 25 in FIG. 2) are omitted for clarity. In operation, drum (tub rotor) 30 is mounted on, and rotated by a spindle (not shown) co-axial with axis of rotation 31.

Figure 4:
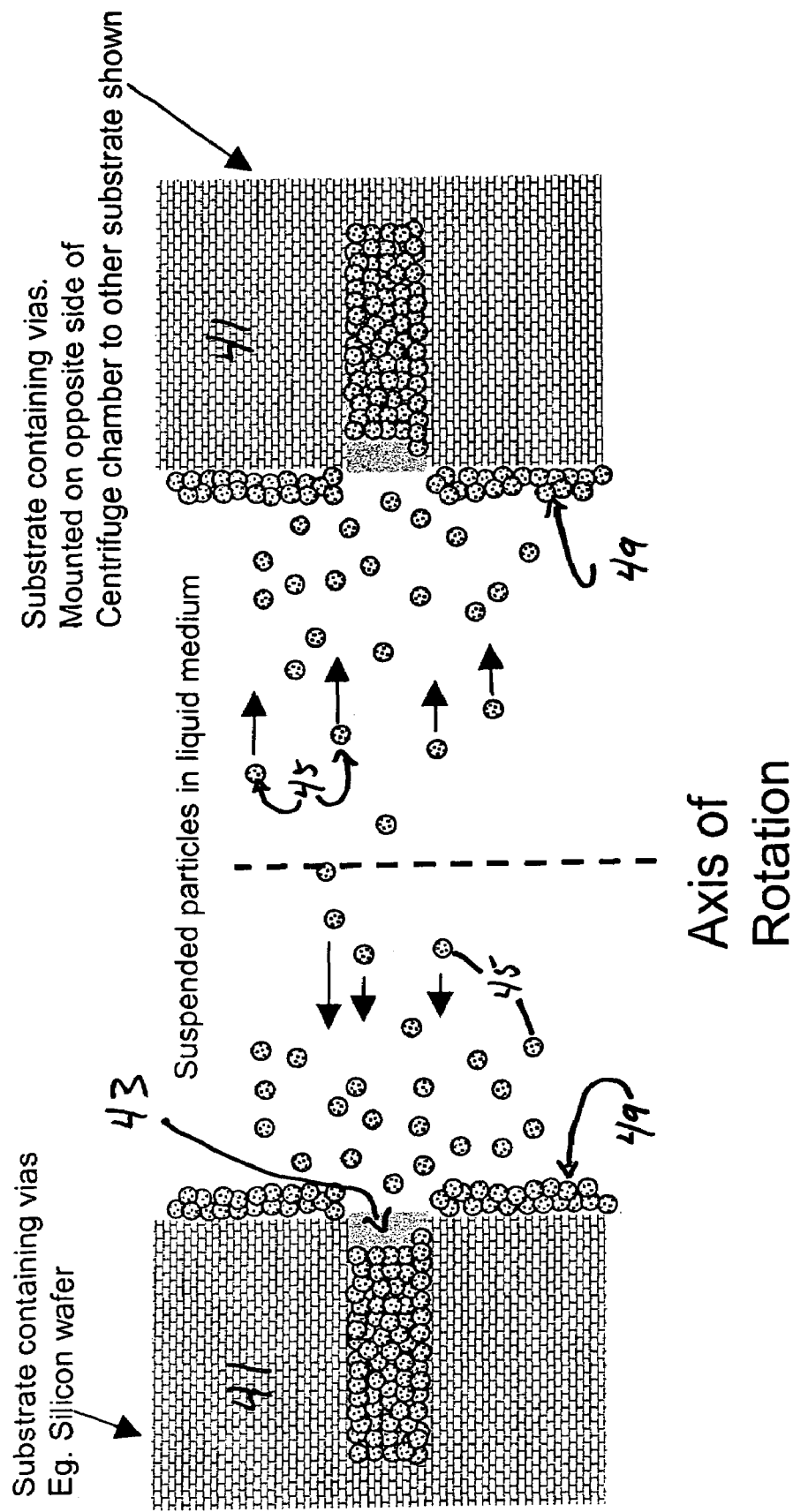
FIG. 4 depicts vias being filled with accumulating particles.
Figure 5:
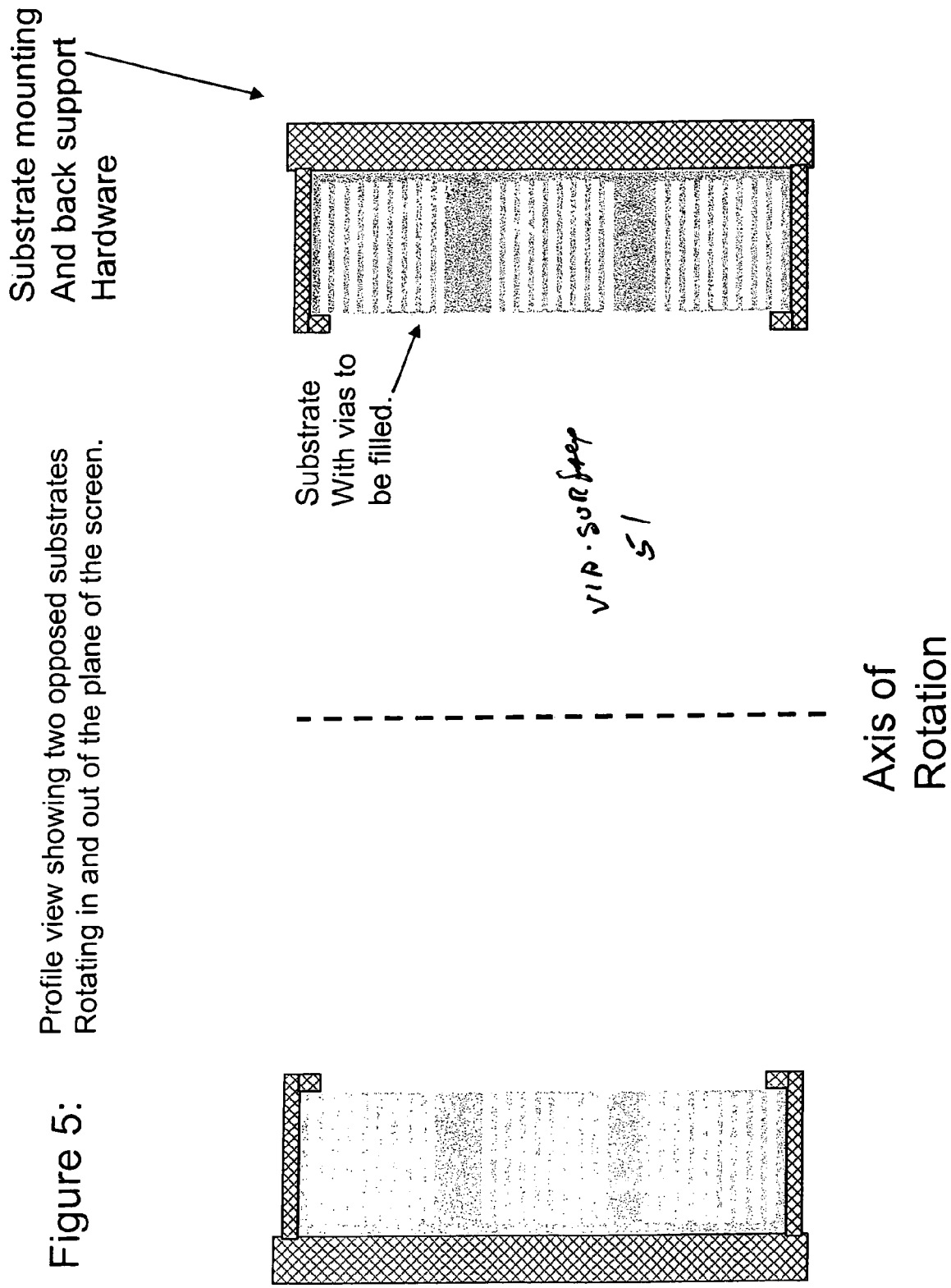
FIG. 5 shows a profile view of two opposed substrates rotating in and out of the plane of the page.
Figure 6:
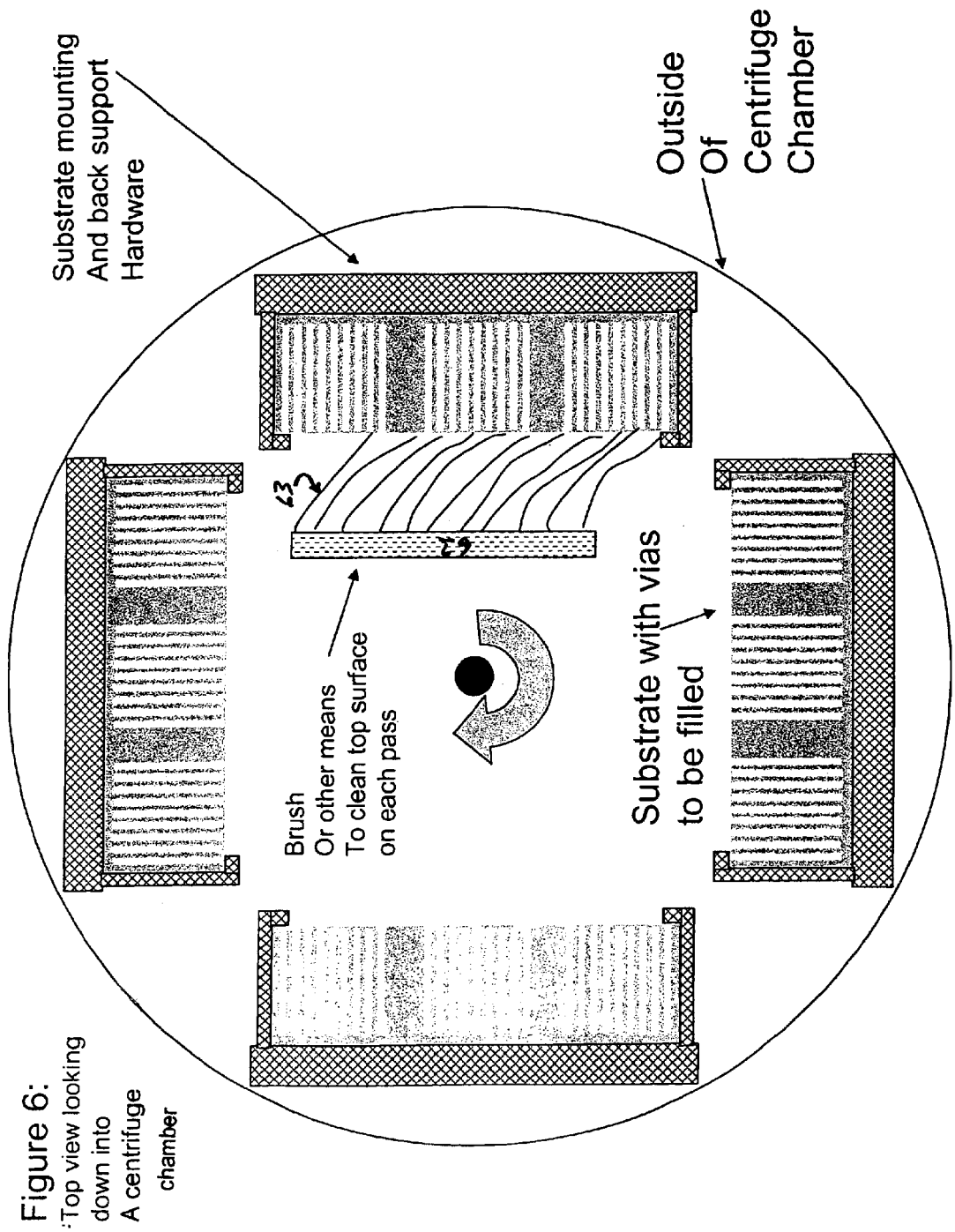
FIG. 6 depicts a brush means disposed to wipe the semiconductor top surface free of accumulating particles.
Figure 9B:
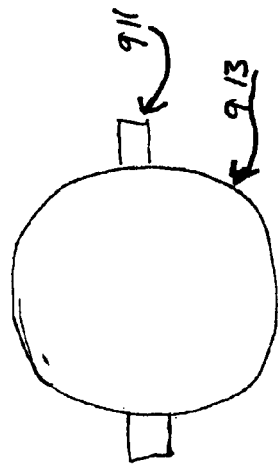
FIG. 9 depicts a bucket adapted for use with a swinging-bucket rotor.
Figure 9C:
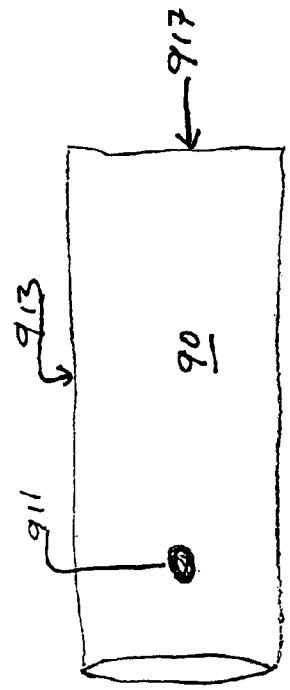
Figure 9D:
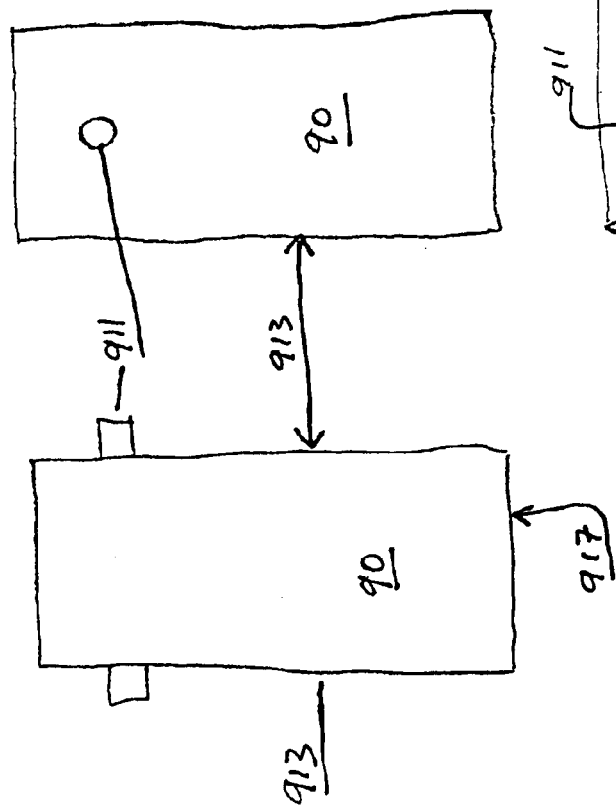
Figure 9D:
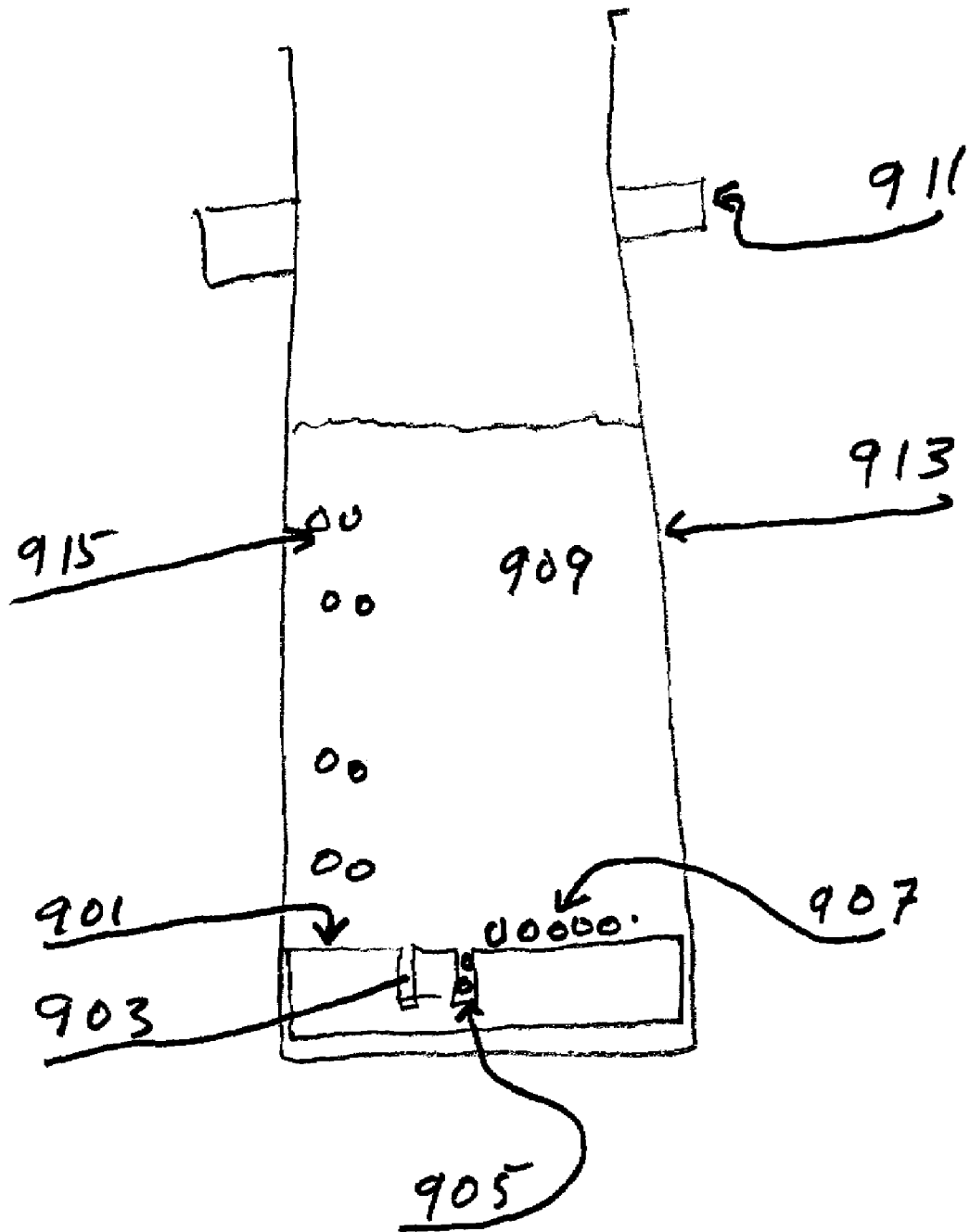

FIG. 4 illustrates the filling process showing a close up of a single via 43 on each of two substrates 41 on opposite sides of the chamber (not shown). Particles 45 suspended in a fluid (not shown) are accelerated radially by the chamber rotation and fill via and trench openings 43. Radial acceleration of particles 45 also causes formation of a mat 49 of particles on the top surface of substrate 41. The top surface of the substrate is known as via-surface 51. In an embodiment, mat 49 remains undisturbed during centrifugation and is removed prior to substrate drying. FIG. 6 depicts an alternative embodiment wherein a brush 61, having bristles or fibers 63 is deposed to remain relatively fixed in position during rotation of the centrifuge. During centrifugation, fibers 63 constantly wipe and dislodge the particles thereby preventing the formation of a mat.

FIG. 8 depicts a spray-filling embodiment of a drum centrifugation method. Substrates, such as semiconductor wafers, are mounted about the inner periphery of the drum of a centrifuge essentially as described in conjunction with FIGS. 2-4 and 6. An axial pipe 83 is disposed within and passing through drum 80. Pipe 83 is disposed to spray a fluid suspension (arrows) radially towards the peripherally-mounted substrates. Rotation of the drum serves to pack the particles into via and trench openings in the substrate. Excess fluid drains from drum 80, is collected by plumbing 85, and is returned to reservoir pump 81, which injects the fluid into pipe 83.

Drum (tub rotor)-type centrifuges have been disclosed as, for example, clothes washing machines. Exemplary disclosures are found in U.S. Pat. No. 6,783,675, to Sans Rovira, et al. and U.S. Pat. No. 4,286,443, to Hunter, the complete disclosures of which is hereby incorporated for all purposes.

A swinging-bucket rotor forms the basis of alternative embodiments of the present invention. Swinging-bucket rotors are disclosed in U.S. Pat. Nos. 5,591,114 and 6,723,238, both to Romanauskas; U.S. Pat. No. 3,997,105 (Hayden et al.); U.S. Pat. No. 4,400,166 (Chulay et al.); and U.S. Pat. No. 4,585,434 (Cole et al.), the complete disclosures of which is hereby incorporated for all purposes.

FIG. 9 depicts a substrate-support bucket to be mounted on, or in, a swinging-bucket rotor. FIG. 9A shows side elevations of bucket 90. The views shows sidewalls 913, which may be diametrically opposed portions of a single cylindrical wall, or may be parallel opposed walls of a substantially rectangular structure. Bucket 90 is mounted on a rotor by means of a pair of trunnion pins 911. Bucket 90 further comprises a bottom wall 917 that serves to support the substrate under the high centrifugal forces experienced during operation. In a top plan view (FIG. 9B), bucket 90 is generally configured to accept the substrate. During loading and unloading operations, bucket 90 hangs with sidewalls 913 in a substantially vertical orientation and bottom 917 substantially horizontal. During centrifugation, bucket 90 pivots about trunnion pin 911 so that sidewalls 913 are oriented substantially parallel to the horizontal (FIG. 9C). Vertical is defined as substantially parallel to the earth's gravity gradient; horizontal is defined as substantially perpendicular to the gravity gradient. FIG. 9D depicts bucket 90 in side section during an unloading operation. Substrate 901 rests on bottom wall 917 and is contained by sidewalls 913. The height of sidewalls 913 is chosen so that the bucket may hold a suitable volume of a fluid 909 containing particles 915 in suspension. Prior to centrifugation, particles 915 are distributed, essentially uniformly throughout the fluid volume. After centrifugation, the particles form a tightly-packed plug 905 in via and trench openings 903 and form a mat 907 on the upper surface of substrate 901. Alternatively, the head member may be adapted to comprise trunnion pins and the bucket member may comprise slots disposed to receive the head-mounted trunnion pins. In either case a pair of pins and/or slots defines a swing axis about which the bucket rotates to the horizontal during operation.

In an embodiment, the substrate and the suspension fluid-particle suspension may be placed directly into the bucket. In an alternative embodiment, the suspension fluid and substrate are placed in a tube or sleeve, which in turn is placed in the bucket. The tube is favorably closed at a bottom end. The tube is favorably shaped to conform to the shape of the internal portion of the bucket.

Figure 10A:
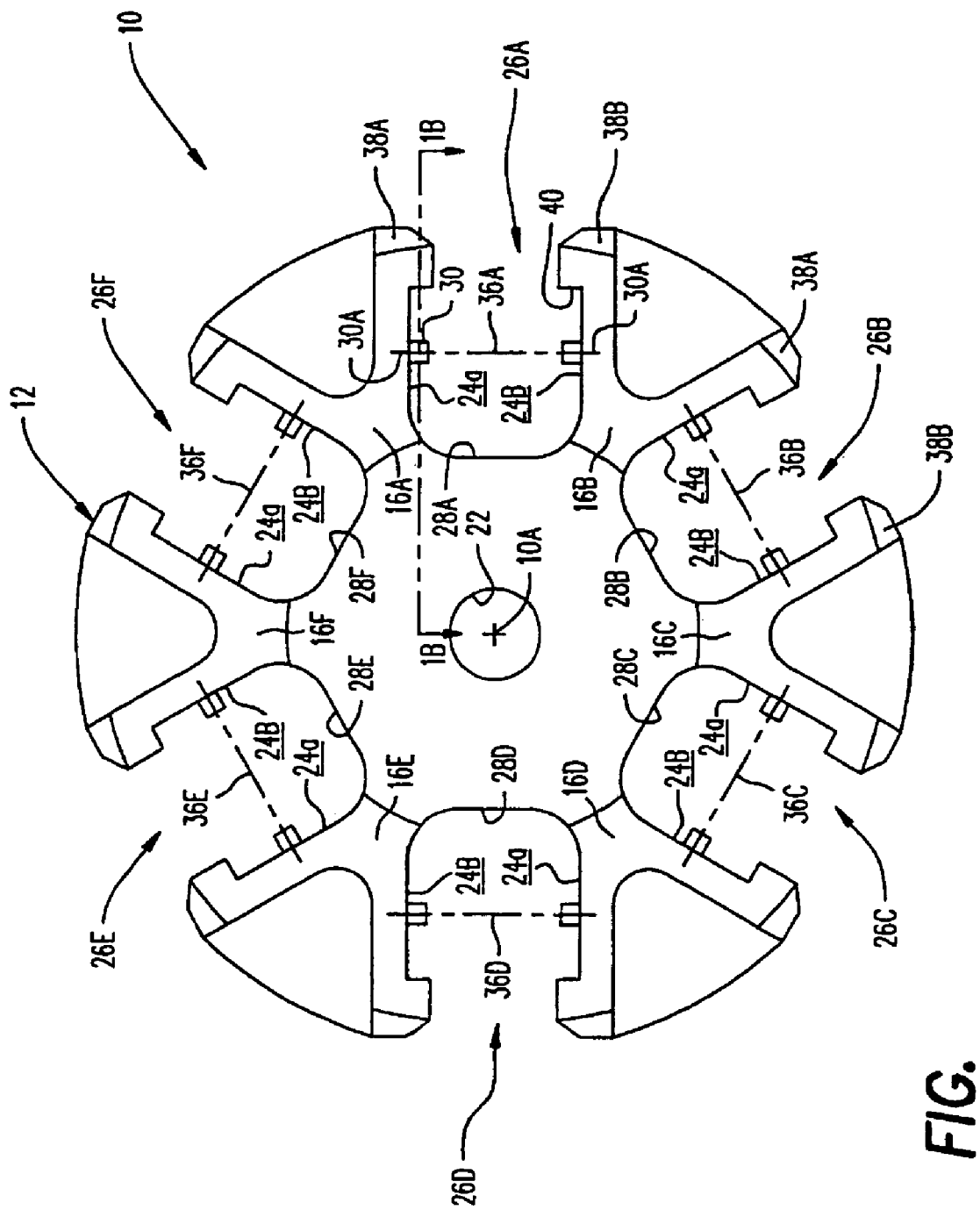
FIG. 10 depicts a swinging-bucket rotor.
Figure 10B:
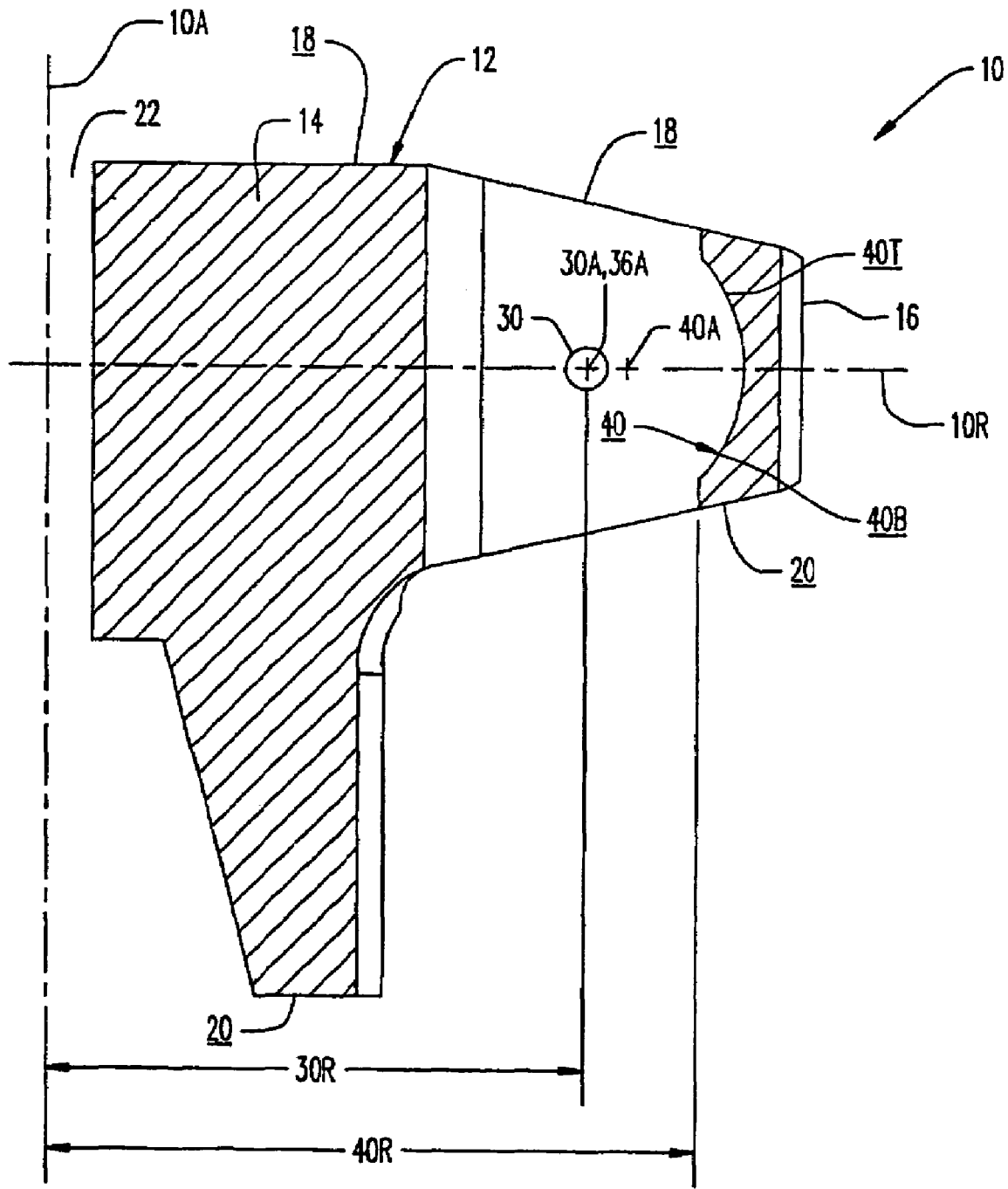

With reference to FIGS. 10A and 10B, respectively shown are a plan view and a side elevation view, partially in section, of a swinging bucket centrifuge rotor generally indicated by the reference character 10. The rotor 10 is a relatively massive member formed from a strong, light weight, material, such as titanium or aluminum, adapted for rotational motion within a centrifuge instrument about a vertical axis of rotation 10A extending therethrough. The rotor 10 includes a body portion 12 having a central hub region 14 from which emanates a plurality of generally radially extending arms. The arms are generally indicated by the reference character 16. Although six arms 16A through 16F are illustrated, it should be understood that any predetermined convenient number of arms may radiate from the hub 14. The rotor 10 has an upper planar surface 18 and a lower surface 20 thereon. A mounting recess 22 extends through the hub 14 from the upper surface 18 to the lower surface 20. The lower portion of the mounting recess 22 is frustoconical in shape to receive the correspondingly tapered upper end of a drive shaft (also termed "spindle," not shown) of a centrifuge instrument whereby the rotor 10 may be coupled to a source of motive force. When mounted to the shaft the axis of the shaft of the instrument aligns with the axis of rotation 10A of the rotor 10. As is best illustrated in FIG. 10B the body 10 has a reference plane 10R that extends therethrough in generally perpendicular relationship to the axis of rotation 10A. That is to say, in the conventional usage, the reference plane 10R is oriented generally horizontally when the rotor 10 is mounted for rotation about a generally vertically disposed axis of rotation 10A.

Each arm 16A through 16F carries thereon a pair of generally parallel, planar sidewalls 24A, 24B, respectively. The sidewall 24A on a given one of the arms 16A through 16F is confrontationally disposed with respect to the sidewall 24B on the next-circumferentially adjacent arm thereby to define a circumferential array of slots 26A through 26F. Each slot extends generally axially through the rotor, (i.e., substantially parallel to the axis of rotation 10A). The paired sidewalls 24A, 24B on respective circumferentially adjacent arms 16 are circumferentially spaced apart sufficiently to accommodate a swinging bucket sample container 90 that will be described more fully herein. The radially inner ends of the paired sidewalls 24A, 24B are joined by a scalloped contoured surface 28A through 28F which affords sufficient head space to accept the head of the bucket 100 to be described when the same swings from its rest toward its operating position. Each planar sidewall 24A, 24B in each confronting pair of sidewalls has a trunnion pin 30 mounted thereon. Each trunnion pin 30 has an axis 30A therethrough. The axis 30A of each trunnion pin 30 extends generally perpendicularly to the planar sidewall 24A, 24B, as the case may be, on which it is mounted. The axes 30A of the trunnion pins disposed on circumferentially adjacent arms lie on a common line 36A through 36F, as shown in FIG. 10A.

Via filling will be most effective when the substrate is centrifuged under a high relative centrifugal field (RCF or "G forces"). This is accomplished by increasing the distance from the axis of rotation or by increasing the rotational velocity or both. The relative centrifugal field is the ratio of the centrifugal acceleration ($r\omega^2$) at a specified radius (r) and angular speed ($\omega$) to the standard acceleration of gravity (g) according to Formula 1; where r is the radius in millimeters, $\omega$ is the angular velocity in radian per second ($2\pi$RPM/60), and g is the standard acceleration of gravity (9807 mm/s$^2$).

$$RCF=(r\omega^2)/g$$

To illustrate the relative ease of obtaining significant G-force in a liquid filled chamber environment on a dimensional scale appropriate to this application, consider a centrifuge chamber, according to a drum embodiment of the present invention, that has the dimensions and rotational velocity of a commercial clothing washing machine. If r=1 foot and spin speed=1000 RPM, then the RCF=340. Thus providing roughly 340 times the force of gravity to pull metal particles into the vias and compress them into a densely packed powder.

During via filling, advantage may be gained by vibration of the substrate and/or the liquid medium, as illustrated in FIG. 7. Mechanical vibration facilitates packing of particles and also serves to break up the formation of logjams of particles clogging the mouth of the openings during fill. For instance, if a cluster of particles forms at a via opening, further filling may be prevented. With adequate vibration, these clusters could be dislodged or broken into smaller units allowing them to enter freely into a via and to allow via filling to resume undeterred.

Mechanical vibration could be carried out in a number of ways. One method would launch sonic or ultrasonic waves into the liquid medium. This would vibrate all components including the substrate and the particles in suspension. Another method would apply vibration to the mounting hardware itself to create a differential vibration between a via opening and the liquid-suspended solids. Alternatively, mechanical vibration may be induced by operating the centrifuge in a dynamically unbalanced state.

In an embodiment, the frequency and amplitude of vibration may be varied so as to determine an optimal vibration for the substrate/suspension system. In a further embodiment, it is favorable to apply multiple frequencies simultaneously. In yet a further embodiment the applied frequency is scanned about an optimum. Frequency scanning has advantages that any membrane vibration that may result in the substrate, especially if thin and flexible like a silicon wafer, would not stay in a resonance condition. If it were to stay in a resonance position, then some areas would experience large amplitude motion while some nodal areas would experience only limited vibration. In an embodiment the direction of the applied vibration may be lateral and/or radial.

In an embodiment, a bias current may be applied to the substrate. Charging the substrate may help to attract the metal component of the suspension thereby facilitate packing.

In a further embodiment, a vacuum is applied to the centrifuge chamber. A vacuum may be applied to remove air or other gasses from the via prior to introducing the fluid suspension. Where via are evacuated, there will be substantially no gas to form voids. A vacuum may be applied after introduction of the fluid suspension to remove gasses that may have dissolved in the fluid. Such an application will tend to suppress gasses evolving from solution during a subsequent process operation such as a sintering step. Such evolved gasses may form voids or otherwise negatively impact vial fill quality. In an embodiment, application of vacuum is continued during operation of the rotor. This facilitates higher rotational speeds of the drum or head, due to lower air resistance and also minimizes heating due to friction with the air. Vacuum centrifuges are well known, especially in the biological arts. The vacuum pressure must be low enough such that gasses dissolved in the suspension fluid tend to evolve from solution. However, the pressure must be high enough such that the suspension fluid substantially remains in the liquid state.

Another embodiment would allow the evaporation of fluid from the tube during centrifugation so that a filled and dried or partly dried substrate would result at end of run.

In a preferred embodiment the mat of material that forms on the upper surface of the substrate is dynamically resuspended by making light contact with a brush or other object during centrifugation. The brush would lightly contact the substrate surface during each rotation as depicted in FIG. 6. In an embodiment, the brush means comprise a "doctor blade," a knife or spatula-shaped member whose long dimension is substantially as large, or larger than the substrate. In an embodiment the brush means may be a stationary or rotating brush. It is preferable that the bristles of the brush have a width greater than the opening of a via on the substrate. It is preferable that the brush means be made of a material softer than the substrate.

In an embodiment, the liquid/solid suspension is sprayed at the substrates while they are spinning instead of having them fully immersed in a liquid suspension. One advantage is that the mass of the chamber will be many times smaller thus enabling higher velocities to be conveniently obtained.

In an embodiment, a hollow cylindrical shell is formed on the outside periphery of the chamber which is filled with liquid. This would leave the great majority of the volume of the chamber empty thus making the total mass much lighter but retaining the benefits of full liquid immersion and with the substrates at the greatest possible radius.

In an embodiment, the metal particles may comprise metal powders, flakes, and metal-coated dielectric particles. The metal particles may comprise substantially a first metal, such as tungsten, with a coating of a second metal, such as copper. Where a portion of the metal fraction is a low melting metal or alloy, such as having a melting point on the order of below about 300° C., then mild heat can be used to cause metallurgical bonding between the metal particles and/or to metal surfaces in contact with the metal particles.

In an embodiment, the particles comprise a core coated with one or more metals. core is selected from the group consisting of metal, glass, ceramic, crystalline powders, and polymers. Each metal may suitably comprise an element or an alloy, such as a solder. Non-limiting examples include: copper-coated tungsten, copper, tin coated copper, multiple layer coatings on an inner core such as tin coating over copper coating over molybdenum.

In an embodiment, the metal comprising the entire particle, or a coating over a core particle, may be selected from complementary, solder-forming metals. By way of non-limiting example, where a first and second metal combine to form a solder, the outer layer of a first portion of the particles may comprise a first metal and an outer layer of a second portion of the particles may comprise the complementary metal. Where a mixture of the particles is packed into a via, they will fuse, under heating to form a solder plug in the via.

Examples of conductive pastes and metal particles that may be utilized to fill the passages of the present invention include that described by U.S. Pat. No. 5,744,285, the entire contents of the disclosure of which is hereby incorporated by reference. U.S. Pat. No. 5,744,285 describes a conductive paste containing silver and silver-coated copper conductive particles in an epoxy resin. Another conductive paste is described by U.S. Pat. No. 5,062,896, the entire contents of the disclosure of which is hereby incorporated by reference. U.S. Pat. No. 5,062,896 describes a conductive paste containing solder alloy, specifically tin/bismuth solder, in a thermoplastic polyimide siloxane resin. Other conductive pastes are described by U.S. Pat. Nos. 5,948,533, 5,376,403, 5,538,789, 5,716,663, and 5,830,389, the entire contents of the disclosures of which are hereby incorporated by reference. These patents describe conductive pastes that include both copper and solder conductive particles in a thermosetting resin. Furthermore, U.S. Pat. No. 6,054,761, the entire contents of the disclosure of which is hereby incorporated by reference, describes a conductive paste with mixed fusible and non-fusible conductive particles in an epoxy resin. Still further, U.S. Pat. No. 6,059,952, the entire contents of the disclosure of which is hereby incorporated by reference, describes a conductive paste with copper conductive particles that are coated with a fusible metal layer in a thermosetting resin. Further yet, U.S. Pat. Nos. 5,977,490 and 5,652,042, the entire contents of the disclosure of both of which is hereby incorporated by reference, describe a conductive paste with copper conductive particles in an epoxy resin. Conductive pastes are disclosed in co-pending docket Ser. No. 09/665,366, the entire contents of which are specifically incorporated in its entirety for all purposes.

In an embodiment, the suspension may comprise ceramic particles having a negative volumetric coefficient of thermal expansion (CTE). A first non-limiting example is $ZrW_2O_8$, commonly referred to as zirconium tungstate, which has a negative volumetric CTE of 10 ppm. (CTE=−10 ppm). A second non-limiting example is beta-eucryptite which has a CTE approximately −5 ppm. The liquid component of the suspension may consist of reactive monomers or oligomers in the melted state. One example would be a bismalemide based material which is a solid at room temperature but melts to a low viscosity at higher temperatures around 130° C. As an example, a mixture of a bismaleimide and a material having a negative CTE (e.g. $ZrW_2O_8$) is made and heated to above the melting point of the bismalemide forming a liquid suspension of a negative CTE ceramic. The substrate containing empty vias or trenches is immersed in the which is heated, or insulated, to keep it in a liquid state. Upon centrifugation, the liquid suspension flows into the via. An elevated temperature is maintained for a time sufficient to permit the bismalemide to crosslink in the via creating a permanent structure with a low net CTE having the high thermal stability characteristic of crosslinked bismalemides. Following centrifugation, the filled substrate may be heated in an oven to accelerate the rate of crosslinking. The CTE of the composite material formed in the via is determined by the volume percent of the crosslinked bismalimide (CTE=60 ppm) and the $ZrW_2O_8$ (CTE=−10 ppm).

FIG. 11 is a micrograph of vias filled by the method of the present invention. The photograph demonstrates that centrifugal packing substantially eliminates the voiding associated with the prior art.

In an embodiment, air and/or other gas is displaced from the via by a wetting fluid. A wetting fluid is one that has a high probability of wetting the surface of the substrate in which the via is formed. Persons of skill may readily determine suitable wetting fluids by inspection of tables of the surface tension of the liquid and the surface energy of the substrate. Persons of skill may also readily determine suitable wetting liquids by measurement of contact angles of drops of test liquids placed on the substrate. The wetting fluid may be the same liquid as the suspension fluid, or it may differ. In a preferred embodiment, the wetting and suspension fluids are miscible. In an embodiment, the suspension fluid displaces the wetting fluid.

In an embodiment, a mold-mask is provided to facilitate filling of the vias. The mold mask is a substantially planar member provided a pattern of through-vias disposed to align with a pattern of vias in the substrate. The mask has an upper, via-surface, disposed to fill with a fluid suspension, and a lower, substrate-contact surface, disposed to contact the upper, via-surface of the substrate. In an embodiment, the through-via formed in the mask are funnel-shaped. The term "funnel-shaped" comprehends a via having an upper-surface opening wider than a lower-surface opening. In an embodiment, a single upper-surface opening may direct a flow of fluid to a plurality of lower-surface openings. In such an embodiment, the cross-sectional area of the upper-surface opening may be substantially greater than the cross-sectional area of any one of, or even the sum of the lower-surface openings.

In embodiment, the array of lower-surface openings of the mask is disposed to be in register with the array of via-surface openings in the substrate. In an alternative embodiment, the array of openings on the substrate surface comprises a plurality of sub-arrays, each comprising less than the total openings of the entire array. In such an embodiment, a plurality of masks may be provided, each mask having an array of lower-surface openings corresponding to at least one of the plurality of the substrate sub-arrays. In operation, the substrate is aligned with a mask comprising a first array of openings and a first sub-array of vias in the substrate is filled with a first fluid suspension. Following centrifugation, the first mask is replaced with a second mask having a second array of openings. A second fluid suspension, of a second composition, is used to fill a second sub-array of vias in the substrate. The process is repeated until each sub-array is filled with an appropriate material. According to the properties of the material used to fill the vias, an individual filled sub-array may be solidified separately prior to filling subsequent sub-arrays, or the entire array may be solidified simultaneously. Therefore, masking with a mold permits filling the array of vias with a single material or with multiple materials according to design advantage.

Following centrifugation, unsolidified material adhering to the upper surface of the substrate may be removed by wiping with a squeegee or a "doctor blade." Preferably the material in contact with the substrate is a softer material than the substrate. Where the excess material on the upper surface of the substrate has solidified, it may be removed by chemical mechanical polishing.

In a embodiment, at least a portion of the vias in the substrate are through-via opening to the lower surface. A gas permeable film or membrane may be provided on the lower surface covering the opening of the through-via. Where the through-via is filled with a viscous material, any gas may be forced from the via through the membrane.

In an embodiment, the fluid suspension may be provided in the form of a sheet of solidified thermoplastic composite. The sheet may be placed on the substrate or on a mold-mask. Heat may be applied to convert the solid thermoplastic to a liquid state prior to centrifugal filling.

In an embodiment, vias are wet by introduction of a wetting fluid under partial vacuum. The substrate is placed in a vacuum chamber attached to an evacuating pump. The pump is operated to reduce the pressure in the chamber. In an embodiment, the vacuum chamber is the centrifuge chamber. In an embodiment, the vacuum chamber is a separate device from the centrifuge. The reduced pressure is one low enough such that gasses dissolved in the wetting fluid tend to evolve from solution. However, the pressure must be high enough such that the wetting fluid substantially remains in the liquid state, or high enough to prevent drying in the timeframe of the centrifuging operation.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

INCORPORATION BY REFERENCE

All publications, patents, patent applications, and pre-grant patent application publications cited in this specification are herein incorporated by reference, and for any and all purposes, as if each individual publication or patent application were specifically and individually indicated to be incorporated by reference. In the case of inconsistencies the present disclosure will prevail.

The invention claimed is:

1. A process for filling via openings on a substrate comprising:
   providing a substrate having via openings defined on a via-surface;
   providing at least a layer of a fluid particulate suspension on said via-surface;
   centrifuging said substrate:
      wherein said centrifugation is performed with a swinging-bucket rotor;
      wherein said fluid particulate suspension comprises:
         a suspension fluid; and
         a plurality of particles;
      wherein said suspension fluid is a reactive fluid comprising a curable liquid resin and a dispersing agent;
         wherein said curable liquid resin comprises polynorbornenes;
         wherein said dispersing agent comprises naphthalene sulfonic acid condensates;
      wherein said plurality of particles is selected from cores coated with metals;
         wherein a first portion of said cores is coated with a first solder-forming metal;
         a second portion of said cores is coated with a solder-forming metal complementary to said first metal; and
         wherein said cores comprise a ceramic having a negative volumetric coefficient of thermal expansion;
         wherein said ceramic is beta-eucryptite; and
      wherein said substrate is electrically biased relative to said fluid particulate suspension;
   brushing said via-surface during centrifugation;
   vibrating said substrate during centrifugation;
   creating a vacuum in a centrifuge chamber;
   spraying a fluid particulate suspension against said via-surface;
   curing said reactive fluid thereby forming a substantially solid mass in said via;
   providing a brush means;
   wiping excess particles from said via-surface using said brush means;
      wherein said brush means comprises doctor blades;
   providing a filler-mask having through-via defined herein,
      said filler-mask having a via-surface disposed to contact said fluid suspension and
      a substrate-contact surface disposed to contact said substrate via-surface; and
   aligning said mask on said substrate via-surface;
      wherein the openings of said through-via are wider at said mask via-surface than at said substrate-contact surface and said through-via has multiple substrate-contact surface openings.

* * * * *